United States Patent
Gieske et al.

(10) Patent No.: US 12,217,824 B2
(45) Date of Patent: Feb. 4, 2025

(54) FINITE TIME COUNTING PERIOD COUNTING OF INFINITE DATA STREAMS

(71) Applicant: Micron Technology, Inc., Boise, ID (US)

(72) Inventors: Edmund Gieske, Cedar Park, TX (US);
Amitava Majumdar, Boise, ID (US);
Cagdas Dirik, Indianola, WA (US);
Sujeet Ayyapureddi, Boise, ID (US);
Yang Lu, Boise, ID (US); Ameen D. Akel, Rancho Cordova, CA (US);
Danilo Caraccio, Milan (IT); Niccolo' Izzo, Milan (IT); Elliott C. Cooper-Balis, San Jose, CA (US);
Markus H. Geiger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 178 days.

(21) Appl. No.: 18/160,292

(22) Filed: Jan. 26, 2023

(65) Prior Publication Data
US 2023/0282258 A1 Sep. 7, 2023

Related U.S. Application Data

(60) Provisional application No. 63/303,896, filed on Jan. 27, 2022.

(51) Int. Cl.
  *G11C 29/52* (2006.01)
  *G11C 7/22* (2006.01)
  *G11C 7/24* (2006.01)

(52) U.S. Cl.
  CPC ............ *G11C 7/24* (2013.01); *G11C 7/222* (2013.01); *G11C 29/52* (2013.01)

(58) Field of Classification Search
  CPC ............ G11C 7/24; G11C 7/222; G11C 29/52
  (Continued)

(56) References Cited

U.S. PATENT DOCUMENTS

2006/0052962 A1* 3/2006 Shipton ............... B41J 2/04586
  702/106
2022/0385846 A1* 12/2022 Higuchi ............... H04N 25/77

OTHER PUBLICATIONS

A. Giray Yaglikçi, et.al. "BlockHammer: Preventing RowHammer at Low Cost by Blacklisting Rapidly-Accessed DRAM Rows" University of Illinois, 15 pages.
(Continued)

*Primary Examiner* — Ly D Pham
(74) *Attorney, Agent, or Firm* — Wood IP LLC; Theodore A. Wood

(57) ABSTRACT

Systems and methods for finite time counting period counting of infinite data streams is presented. In particular example systems and methods enable counting row accesses to a memory media device over predetermined time intervals in order to deterministically detect row hammer attacks on the memory media device. Example embodiments use two identical tables that are reset at times offset in relation to each other in a ping-pong manner in order to ensure that there exists no false negative detections. The counting techniques described in this disclosure can be used in various types of row hammer mitigation techniques and can be implemented in content addressable memory or another type of memory. The mitigation may be implemented on a per-bank basis, per-channel basis or per-memory media device basis. The memory media device may be a dynamic random access memory type device.

20 Claims, 17 Drawing Sheets

(58) Field of Classification Search
USPC .................................................. 365/185.09
See application file for complete search history.

(56) References Cited

OTHER PUBLICATIONS

Zhaogeng Li, et al. "Compression of Pending Index Table with Bloom Filter in Content Centric Network," Department of Computer Science, Network Research Center. Tsinghua University, Beijing 10084, p. 46.

* cited by examiner

| Row Hammer Response | Data Integrity Assured | Needs Media Repair Mode | Required Time for Response | Impact Granularity |
|---|---|---|---|---|
| Bias Cache Replacement | < associativity | No | 0 | Cache set |
| Increased Refresh | No | No | ~300nS ($t_{RFC}$) | Logical Bank |
| ACT/PRE Neighbor Rows | Yes | Yes | ≥90nS (2x $t_{RC}$) | ≥2 Rows |
| Poor-man's dRFM | Yes | No | 1uS (2x-5x RFM+$t_{RC}$) | ≥1 Rows |
| dRFM | Yes | No | 200nS | ≥1 Rows |
| EDAC Scrub Neighbors ** | Yes++ | Yes | ≥5uS? (4x $t_{RC}$+256x $t_{CCD}$) | ≥2 Rows |
| Throttle ACTs to CRHA Rows | Yes | No | ≥10uS (allowed ACT rate) | ≥1 Rows |
| Respond w/ Data_Bad | Yes | No | 0 | ≥1 Rows |
| Alert (interrupt) Host OS | w/ other | No | >100uS on host | ≥1 Rows |

FIGURE 9

FINITE TIME COUNTING PERIOD COUNTING OF INFINITE DATA STREAMS

CROSS REFERENCE TO RELATED APPLICATIONS

This application claims priority from U.S. Provisional Application No. 63/303,896, filed Jan. 27, 2022, the contents of which are hereby incorporated by reference. Additionally, this application is related to the following commonly assigned U.S. Patent Applications: U.S. application Ser. No. 17/897,813 filed Aug. 29, 2022, entitled "Area-Optimized Row Hammer Mitigation;" U.S. application Ser. No. 17/941,655 filed Sep. 9, 2022, entitled "Aliased Row Hammer Detector," the contents of each of which are hereby incorporated by reference.

FIELD OF TECHNOLOGY

The present disclosure relates to keeping count of events in a device based on long or infinite data streams, such as, for example, a memory media device's row activations.

BACKGROUND

Memory devices (also referred to as "memory media devices") are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), flash memory, and others. Memory devices may be volatile or non-volatile. Volatile memory cells (e.g., DRAM cells) may lose their programmed states over time unless they are periodically refreshed by an external power source. SRAM memory may maintain their programmed states for the duration of the system being powered on. Non-volatile memory cells (e.g., NAND memory cells) may maintain their programmed states for extended periods of time even in the absence of an external power source.

Memory devices may be coupled to a host (e.g., a host computing device) to store data, commands, and/or instructions for use by the host while the computer or other electronic system is operating. For example, data, commands, and/or instructions can be transferred between the host and the memory device(s) during operation of a computing or other electronic system. A controller, referred to as a "memory controller", may be used to manage the transfer of data, commands, and/or instructions between the host and the memory devices.

DRAM is organized as an array of storage cells with each cell storing a programmed value. As noted above, the cells can lose their programmed values if not periodically refreshed. Thus, the rows are refreshed at a fixed interval often referred to as the "refresh interval". The refresh is a type of a "row activation". In a row activation, a row in the DRAM device is read, error corrected and written back to that same physical row. Other row accesses (e.g., for write to row or read row) also results in a row activation. Data corruption caused by "row hammer events" (also referred to as "row hammer attacks") are a significant risk in recent DRAM devices.

A row hammer event occurs when a particular row in a media device is accessed too many times, that is, more than a "row hammer threshold" (RHT) number of times, in an "activation interval" (i.e., the interval between two refresh/activation events). Specifically, when a particular row (an "aggressor row") is accessed more than a RHT number of times during an activation interval, one or more rows ("victim rows") that are physically proximate to that particular row in the DRAM media can be affected as a result of the frequent activation of the particular row, and data corruption of the one or more rows may occur. Due to various physical effects of shrinking manufacturing process geometries, the RHT of memory devices has decreased to a level at which even normal computer system programs can inadvertently corrupt their own data or the data of another program sharing the same system's memory. Conventional row hammer detection techniques are either practical but imperfect allowing data corruption or severe performance degradation, or perfect but impractically costly in required resources.

Conventional row hammer detector algorithms, such as "Address Sampling" and "Priority CAM" (priority content addressable memory) are probabilistic and thus cannot guarantee perfect (i.e., complete, accurate, and precise) prevention of data corruption in any and all row hammer scenarios. If an aggressor (e.g., a malicious attacker) knows sufficient details of these conventional row hammer detection methods and their implementation, the aggressor can attack their weaknesses to bypass or break them and corrupt data.

The "direct" or "perfect" row tracking method, in which a counter is maintained for each row in the DRAM media, is a known perfect row hammer detection algorithm, but its implementation requires both amounts of memory and operating power that are too high to be practically useful.

Guaranteed row hammer event elimination is compelling for any memory device, but is especially compelling for systems such as, for example, hyperscale datacenters (HSDC). In HSDCs, typically multiple customers share processors and memory. A malicious attacker can use row hammer attacks to silently (e.g., without detection) corrupt other customers' data to possibly escalate its privilege to take control of more system resources or compromise data center security.

Currently row hammer corruption is indistinguishable from other soft errors. Modem workloads thrash processor caches and cause unintentional row hammer scenarios. Detected errors beyond a threshold rate require physical service of the dual in-line memory modules (DIMMs) which are often returned to the supplier for credit.

Therefore, improved techniques for mitigating soft errors such as row hammer errors are desired.

BRIEF DESCRIPTION OF THE DRAWINGS

FIG. 9 illustrates a table of different row hammer attack responses that can be implemented, according to some example embodiments.

DETAILED DESCRIPTION

This disclosure describes systems, apparatuses, and methods related to a detector for memory media soft errors, such as, for example, row hammer errors.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

In some embodiments, the row hammer detector and its row access counting circuitry is located in a "memory controller". The memory controller can orchestrate performance of operations to write data to at least one of multiple types of memory devices.

Figure 1A:
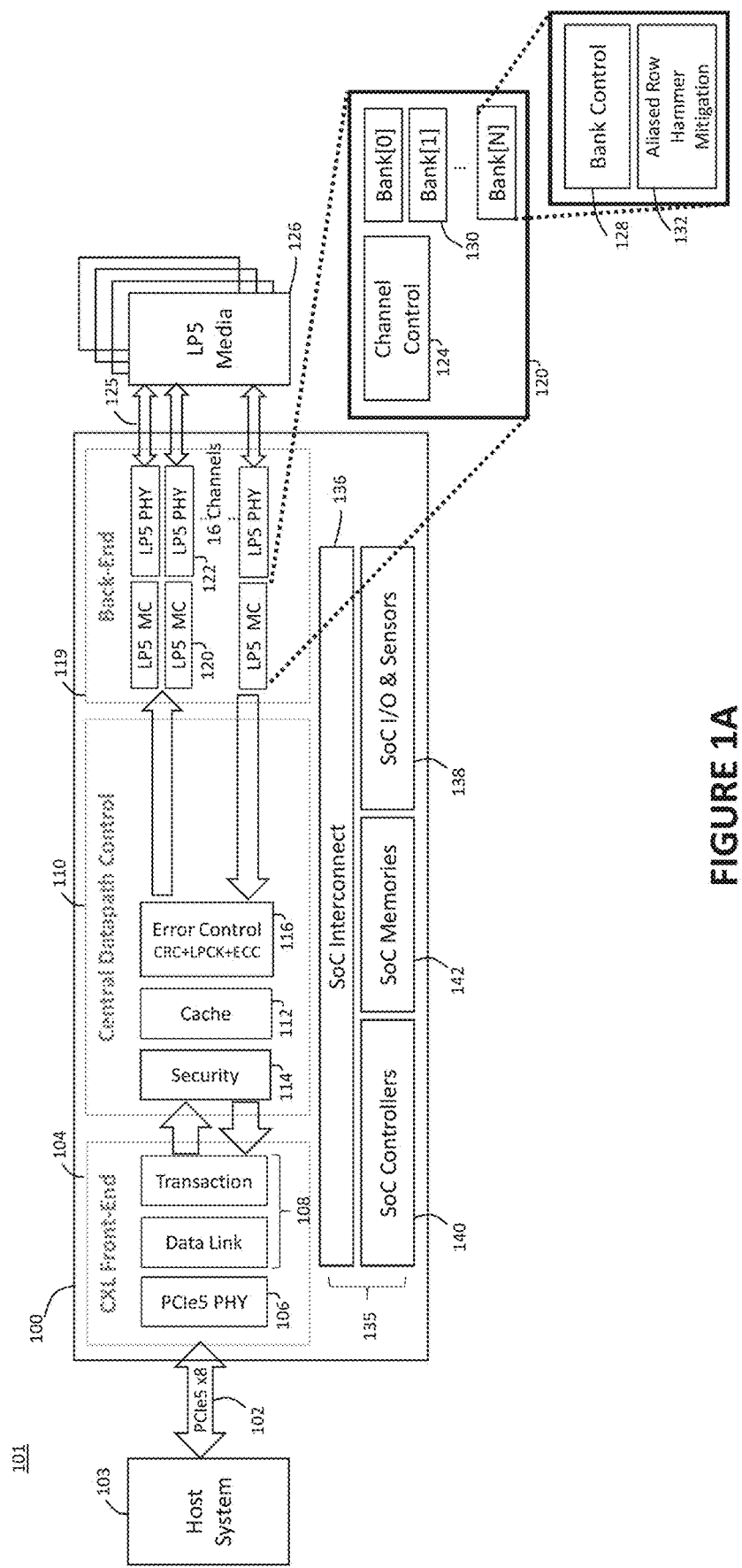
FIGS. 1A-1C illustrates an example functional block diagram in the form of a computing system including a memory controller configured for detecting row hammer attacks using row access counters in accordance with some example embodiments of the present disclosure.

FIG. 1A illustrates an example functional block diagram in the form of a computing system 101 including a memory controller 100 configured for detecting row hammer attacks in accordance with some embodiments of the present disclosure. The computing system 101 can detect and mitigate row hammer attacks on one or more memory devices 126. The memory controller 100 comprises a front end portion 104, a central controller portion 110, a back end portion 119, and a management unit 135. The memory controller 100 can be coupled to a host 103 (i.e., host system 103) and memory device 126. In some embodiments, memory device 126 may be a DRAM device.

The front end portion 104 includes an interface 106 to couple the memory controller 100 to the host 103 through one or more input/output (I/O) lanes 102. The communications over I/O lanes 102 may be according to a protocol such as, for example, Peripheral Component Interconnect Express (PCIe). In some embodiments, the plurality of I/O lanes 102 can be configured as a single port. Example embodiments are not limited by the number of I/O lanes, whether or not the I/O lanes belong to a single port, or the communication protocol for communicating with the host. The interface 106 receives data and/or commands from host 103 through I/O lanes 102. In an embodiment, the interface 106 is a physical (PHY) interface configured for PCIe communications. The front end portion 104 may include interface management circuitry 108 (including data link and transaction control) which may provide higher layer protocol support for communications with host 103 through PHY interface 106.

The central controller portion 110 is configured to control, in response to receiving a request or command from host 103, performance of a memory operation. The memory operation can be a memory operation to read data from, or write data to, memory device 126. The central controller portion 110 may comprise a cache memory 112 to store data associated with the performance of the memory operation, a security component 114 configured to encrypt the data before storing, and to decrypt data after reading, the data in memory device 126.

In some embodiments, in response to receiving a request from host 103, data from host 103 can be stored in cache lines of cache memory 112. The data in the cache memory can be written to memory device 126. An error correction component 116 is configured to provide error correction to data read from and/or written to memory device 126. In some embodiments, the data can be encrypted using an encryption protocol such as, for example, Advanced Encryption Standard (AES) encryption, before the data is stored in the cache memory. In some embodiments, the central controller portion 110 can, in response to receiving a request from host 103, control writing of multiple pages of data substantially simultaneously to memory device 126.

The management unit 135 is configured to control operations of the memory controller 100. The management unit may recognize commands from the host 103 and accordingly manage the one or more memory devices 126. In some embodiments, the management unit 135 includes an I/O bus 138 to manage out-of-band data, a management unit controller 140 to execute a firmware whose functionalities include, but not limited to, monitoring and configuring the characteristics of the memory controller 100, and a management unit memory 142 to store data associated with memory controller 100 functionalities. The management unit controller 140 may also execute instructions associated with initializing and configuring the characteristics of the memory controller 100. An endpoint of the management unit 135 can be exposed to the host system 103 to manage data through a communication channel using the I/O bus 138.

A second endpoint of the management unit 135 can be exposed to the host system 103 to manage data through a communication channel using interface 106. In some embodiments, the characteristics monitored by the management unit 135 can include a voltage supplied to the memory controller 100 or a temperature measured by an external sensor, or both. Further, the management unit 135 can include a local bus interconnect 136 to couple different components of the memory controller 100. In some embodiments, the local bus interconnect 136 can include, but is not limited to, an advanced high performance bus (AHB).

The management unit 135 can include a management unit controller 140. In some embodiments, the management unit controller 140 can be a controller that meets the Joint Test Action Group (JTAG) standard and operate according to an Inter-Integrate Circuit (I2C) protocol, and auxiliary I/O circuitry. As used herein, the term "JTAG" generally refers to an industry standard for verifying designs and testing printed circuitry boards after manufacture. As used herein, the term "I2C" generally refers to a serial protocol for a two-wire interface to connect low-speed devices like microcontrollers, I/O interfaces, and other similar peripherals in embedded systems.

The back end portion 119 is configured to couple to one or more types of memory devices (e.g. DRAM media 126) via (e.g., through) a plurality of channels 125, which can be used to read/write data to/from the memory devices 126, to transmit commands to memory device 126, to receive status and statistics from memory device 126, etc. The management unit 135 can couple, by initializing and/or configuring the memory controller 100 and/or the memory device 126 accordingly, the memory controller 100 to external circuitry or an external device, such as host 103 that can generate requests to read or write data to and/or from the memory device(s). The management unit 135 is configured to recognize received commands from the host 103 and to execute instructions to apply a particular operation code associated with received host commands for each of a plurality of channels coupled to the memory device 126.

The back end portion 119 includes a media controller portion comprising a plurality of media controllers 120 and a physical (PHY) layer portion comprising a plurality of PHY interfaces 122. In some embodiments, the back end portion 119 is configured to couple the PHY interfaces 122 to a plurality of memory ranks of the memory device 126. Memory ranks can be connected to the memory controller 100 via a plurality of channels 125. A respective media controller 120 and a corresponding PHY interface 122 may drive a channel 125 to a memory rank. In some embodiments, each media controller 120 can execute commands independent of the other media controllers 120. Therefore, data can be transferred from one PHY interface 122 through a channel 125 to memory device 126 independent of other PHY interfaces 122 and channels 125.

Each PHY interface 122 may operate in accordance with a physical (PHY) layer that couples the memory controller 100 to one or more memory ranks in the memory device 126. As used herein, the term "PHY layer" generally refers to the physical layer in the Open Systems Interconnection (OSI) model of a computing system. The PHY layer may be the first (e.g., lowest) layer of the OSI model and can be used transfer data over a physical data transmission medium.

In some embodiments, the physical data transmission medium can be a plurality of channels 125. As used herein, the term "memory ranks" generally refers to a plurality of memory chips (e.g., DRAM memory chips) that can be accessed simultaneously. In some embodiments, a memory rank can be sixty-four (64) bits wide and each memory rank can have eight (8) pages. In some embodiments, a page size of a first type of memory device can be larger than a page size of the second type of memory device. Example embodiments, however, are not limited to particular widths of memory ranks or page sizes.

Each media controller 120 may include a channel control circuitry 124 and a plurality of bank control circuitry 128 where a respective one of the plurality of bank control circuitry 128 is configured to access a respective bank 130 of the plurality of banks on the media device 126 accessed by the respective media controller 120. As described in more detail below a memory error detector, or more particularly a respective per-bank row hammer mitigation circuitry 132, is configured for each bank 120 in each channel in embodiments of this disclosure.

Rank, channel, and bank can be considered hardware-dependent logical groupings of storage locations in the media device. The mapping of rank, channel and bank logical groupings to physical storage locations or rows in the memory device 126 may be preconfigured or may be configurable in some embodiments by the memory controller in communication with the memory device 126.

In some embodiments, the memory controller 100 can be a Compute Express Link™ (CXL) compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as input/output (I/O) protocol, memory protocol (e.g., initially allowing a host to share memory with an accelerator), and coherency interface. When the memory controller 100 is CXL compliant, the interface management circuitry 108 (including data link and transaction control 108) may use CXL protocols to manage the interface 106 which may comprise PCIe PHY interfaces.

According to some embodiments, the memory device 126 includes one or more DRAM devices. In some embodiments, main memory is stored in DRAM cells that have high storage density. DRAM cells lose their state over time. That is, the DRAM cells must be refreshed periodically, hence the name "Dynamic". DRAM can be described as being organized according to a hierarchy of storage organization comprising DIMM, rank, bank, and array. A DIMM comprises a plurality of DRAM chips, and the plurality of chips in a DIMM are organized into one or more "ranks". Each chip is formed of a plurality of "banks". A bank is formed of one or more "rows" of the array of memory cells. All banks within the rank share all address and control pins. All banks are independent, but in some embodiments only one bank in a rank can be accessed at a time. Because of electrical constraints, only a few DIMMs can be attached to a bus. Ranks help increase the capacity on a DIMM.

Multiple DRAM chips are used for every access to improve data transfer bandwidth. Multiple banks are provided so that the computing system can be simultaneously working on different requests. To maximize density, arrays within a bank are made large, rows are wide, and row buffers are wide (8 KB read for a 64 B request). Each array provides a single bit to the output pin in a cycle (for high density and because there are few pins). DRAM chips are often described as ×N, where N refers to the number of output pins; one rank may be composed of eight ×8 DRAM chips (e.g., the data bus is 64 bits). Banks and ranks offer memory parallelism, and the memory controller 100 may schedule memory accesses to maximize row buffer hit rates and bank/rank parallelism.

In the embodiment illustrated in FIG. 1A, the memory device 126 is low power double data rate (LPDDR) LP5 or other similar memory interfaces. However, embodiments are not limited thereto, and memory device 126 may comprise one or more memory media of any memory media types, such as, but not limited to, types of DRAM, that are subject to row hammer attacks or similar memory attacks.

Each of the plurality of media controllers 120 can receive the same command and address and drive the plurality of channels 125 substantially simultaneously. By using the same command and address for the plurality of media controllers, each of the plurality of media controllers 120 can utilize the plurality of channels 125 to perform the same memory operation on the same plurality memory cells. Each media controller 120 can correspond to a RAID component. As used herein, the term "substantially" intends that the characteristic needs not be absolute but is close enough so as to achieve the advantages of the characteristic.

For example, "substantially simultaneously" is not limited to operations that are performed absolutely simultaneously and can include timings that are intended to be simultaneous but due to manufacturing limitations may not be precisely simultaneously. For example, due to read/write delays that may be exhibited by various interfaces (e.g., LPDDR5 vs. PCIe), media controllers that are utilized "substantially simultaneously" may not start or finish at the same time. For example, the multiple memory controllers can be utilized such that they are writing data to the memory devices at the same time regardless if one of the media controllers commences or terminates prior to the other.

In FIG. 1A, the row hammer mitigation component 132 is implemented at the per-bank level in memory controller 100 in the system 101. In contrast, in the memory controller 100' of system 101' shown in FIG. 1B, the row hammer mitigation component 132 is implemented at the per-channel level. Alternatively, in the memory controller 100" in system 101" shown in FIG. 1C, the row hammer mitigation component is implemented at the memory media device level.

Figure 2A:
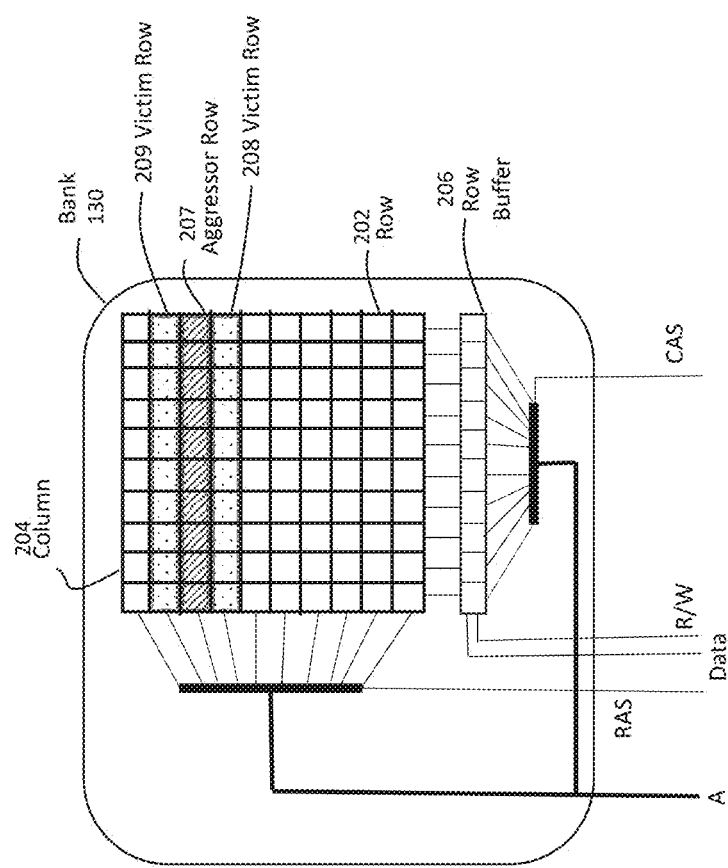
FIG. 2A illustrates a schematic view of a memory bank in a DRAM media device.

FIG. 2A illustrates a schematic view of a memory bank 130 viewed in a DRAM device such as memory device 126. The illustrated bank 130 represents a 10×10 array of cells organized in 10 rows (e.g., row 202) and 10 columns (e.g., column 204). The bank is stored to or read from, one row at a time, via a row buffer 206. Each cell in the array is accessed by providing a row address and a column address. The address bus, a row access strobe signal, a column access strobe signal (shown in FIG. 2A as A, RAS, CAS, respectively) are used to access particular memory locations in the array. The row buffer 206 and the data or read/write signals are used for the data to be read from or stored to memory locations.

In some memory devices, a counter, not shown in FIG. 2A, may be associated with a row to keep track of the number of times that row has been activated during a particular time interval. For example, the counter may be initialized at the beginning of each refresh interval and be incremented for each access to that row during that refresh interval. In conventional perfect tracking implementations, a respective counter was associated with each row. In example embodiments, the number of counters maintained is much smaller than the total number of rows in the memory device(s) attached to the memory controller.

Figure 2B:
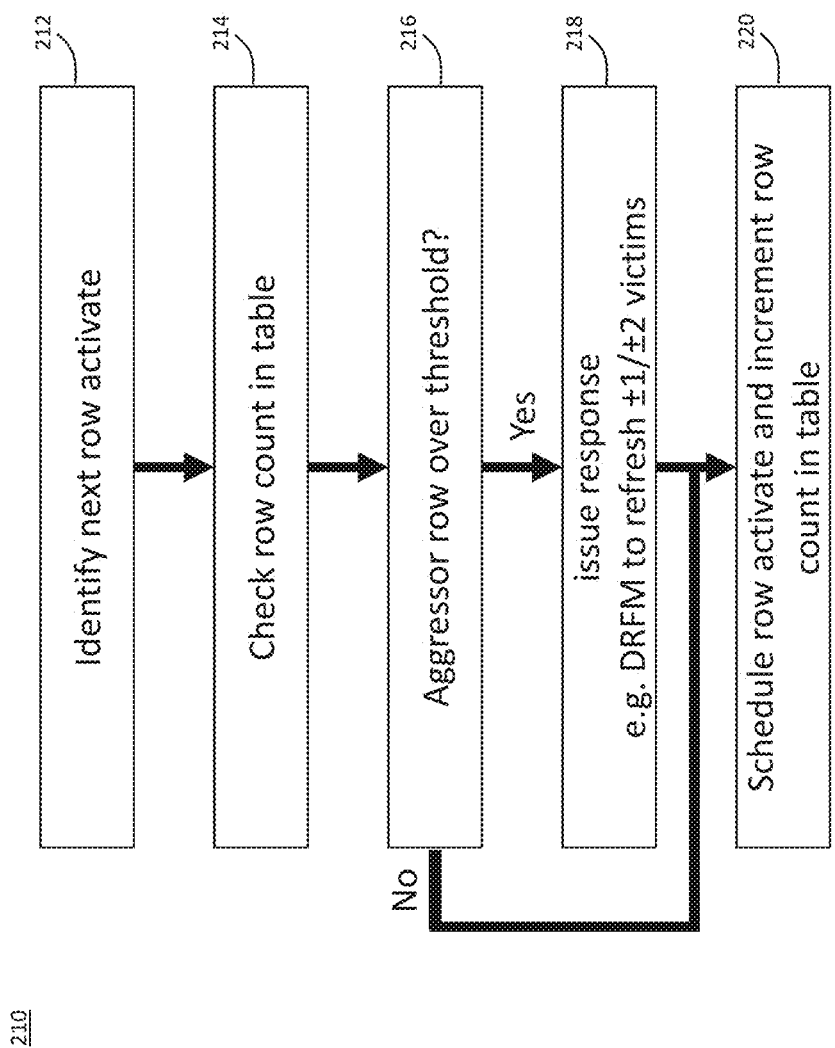
FIG. 2B illustrates a flowchart depicting a basic implementation flow of row hammer mitigation.

FIG. 2B illustrates a flowchart 210 depicting a basic implementation flow of row hammer mitigation. Row hammer mitigation includes two aspects: the first aspect is row hammer detection, and the second aspect is the response to that detection. A variety of responses are possible, with a response commanding the memory device 126 to refresh victim rows (e.g., dRFM response) being one of the possible responses to mitigate or eliminate the effects of row hammer effects. In some instances, the memory controller transmits a refresh command, such as a dRFM response, to the memory device 126 and specifies the aggressor row, and the memory device's internal circuitry determines the victim rows to be refreshed based on the aggressor row identified by the memory controller and refreshes the victim rows.

When a request is received to access a row, which may be referred to as the "aggressor row" (row 207 in FIG. 2A) in this disclosure, in the memory device 126, at operation 212 that row is identified as the next row to activate. At operation 214, a value of a counter configured to keep track of the number of accesses to the aggressor row in a predetermined time period is checked. At operation 216, it is determined whether the value of the counter is above the RHT. When the RHT is exceeded for the aggressor row 207, the integrity of the data in one or more rows (referred to as "victim rows"; see rows 208 and 209 in FIG. 2A) physically adjacent to the aggressor row 207 cannot be guaranteed. The RHT may be factory set or may be configured at boot time and may depend on the type of the memory media device. If the value is above the RHT, then at operation 218 a response is issued.

One type of response may be a digital refresh management (dRFM) command to refresh the physically adjacent rows (e.g., rows 208 and 209) on either side of the aggressor row 207. When a response is issued at operation 218, the counters of the victim rows (e.g., rows 208 and 209) which are refreshed can be reset (e.g., set to 0). The number of physically adjacent rows to refresh may be preconfigured or may be dynamically determined. After issuing the response at 218, or if at operation 216 it was determined that the aggressor row 207 is not over the RHT, at operation 220, the row activate for the aggressor row is scheduled and the counter for that row is incremented (e.g., incremented by 1).

As noted above, memory device 126 such as, for example, one or more DRAM DIMMs, can be subject to row hammer attacks, and several approaches are being used to either eliminate or reduce the effects of such attacks. Whereas the conventional techniques of row hammer mitigation that are currently implemented in memory systems, to the knowledge of the inventors, fall short in terms of practicality in either energy efficiency and/or space efficiency, the row hammer mitigation techniques enabled by the example embodiments of the present disclosure provide perfect tracking (i.e. does not allow any false negative row hammer detection) of row hammer attacks in a practical, energy and/or space efficient manner.

Figure 3:
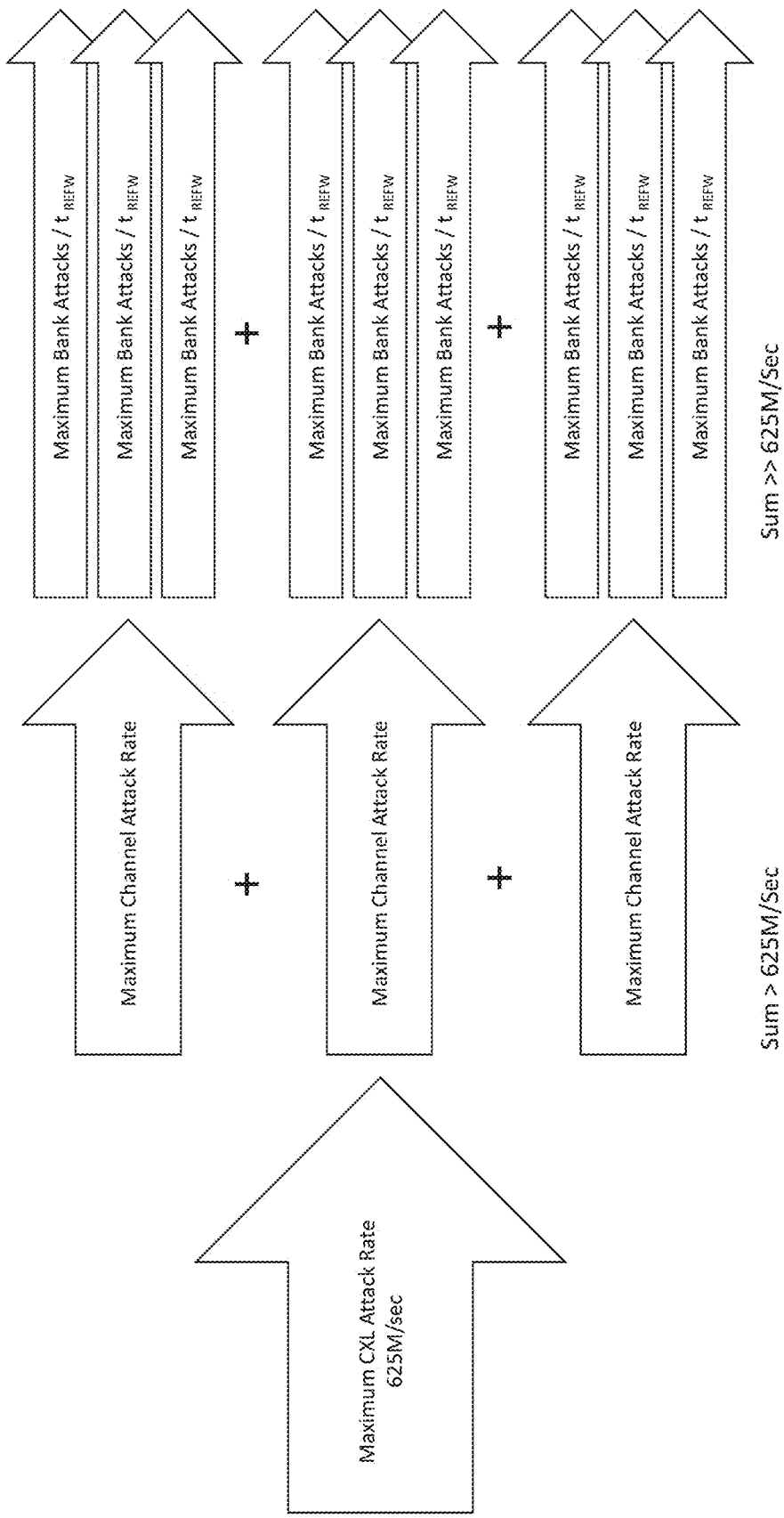
FIG. 3 graphically illustrates an example distribution of row hammer events at the global level in a memory controller, at the channel level and at the bank level.

As shown in FIG. 3, in some example scenarios in which a DRAM memory device is attached to a CXL-compliant memory controller, the global rate of row hammer attacks on the memory device may be about 625 million attacks per second. Thus, if perfect row hammer detection is implemented at the global level for the attached memory device, the row hammer detector must be configured with sufficient counters to detect at least that many attacks occurring in the duration of a second. For example, in the example embodiment shown in FIG. 1A, if perfect row tracking were to be implemented globally, the central controller 110 could be configured with a row hammer mitigation circuitry that receives row access information for rows in the attached memory device from the media controllers 120 potentially at the rate of 625 million per second, and communicates mitigation responses (e.g., dRFM) to the respective media controllers 120 as needed.

If per-channel row hammer mitigation is implemented for each media controller 120, then the sum of the attack rates that can be handled by the respective media controllers 120 must at least amount to the 625 million/sec, but such an implementation will be capable of, and accordingly use the space and energy resources required, for tracking a substantially higher rate of row updates because the resources are configured on a per channel basis.

Similarly, if per-bank row hammer mitigation is implemented in each bank controller 128 for each bank in a channel, then the sum of attack rates that can be handled by all the bank controllers must at least amount to the 625 million/sec, but such an implementation will be capable of, and accordingly use the space and energy resources required for, detecting a substantially higher detection rate because the resources are configured on a per-bank basis. Thus, the total amount of space and energy resources that may be required to implement row hammer detection at the bank level exceeds the amount of space and energy resources that may be required at the channel level, which in turn exceeds that of the global level implementation.

Thus, various approaches may be considered to achieve perfect (deterministic) row hammer tracking in the memory controller by accessing multiple rows as one unit (same row on different chips) and thus having only one counter for the group, rather than having a counter for each row of the media device.

As noted above, memory device 126 such as, for example, DRAM, can be subject to row hammer attacks, and several approaches are being used to either eliminate or reduce the effects of such attacks. Whereas the conventional techniques of row hammer mitigation that are currently implemented in memory systems, to the knowledge of the inventors, fall short in either energy efficiency and/or space efficiency, the present disclosure provides systems and methods for counting row activations in memory media to enable a row hammer mitigation technique that yields perfect tracking (i.e. does not allow any false negative row hammer detection) of row hammer attacks in practical, energy and/or space efficient manner.

A motivation for the approach to the row hammer mitigation solution enabled by the row activation event counting systems and methods described in this disclosure is that it is very space inefficient to have a separate counter for each and every media row on the media device, and therefore other implementations, having a smaller memory footprint for the counters, are needed to provide a perfect tracking for row hammer detection. Instead of dedicating a respective row access counter for each row in the media device, the example embodiments in this disclosure alias each counter to represent multiple rows in the media device. That is, each counter keeps count for a respectively different set of media rows, where the set includes more than one media row. By assigning each counter to keep track of access to more than one media row, the total number of counters that is required to be maintained is reduced. Additionally, the counter incrementing and the threshold testing required by example embodiments can be done very efficiently in three clock cycles. The tradeoff to the space saving by having multiple rows per counter instead of one row per counter, is that the shared counter will likely reach the RHT more frequently because a counter is now incremented upon accesses to any of the multiple rows which it is assigned to. However, since it has been observed that row hammer events are rare (that is, the instances in which the number of accesses to a particular media row exceeding the RHT within a refresh interval is infrequent), the example embodiments seek to provide perfect tracking while optimizing the space savings and the frequent events (e.g., counter increment and threshold test on every row access) at the expense of the more infrequent events (e.g., counters exceeding the RHT).

Figure 4A:
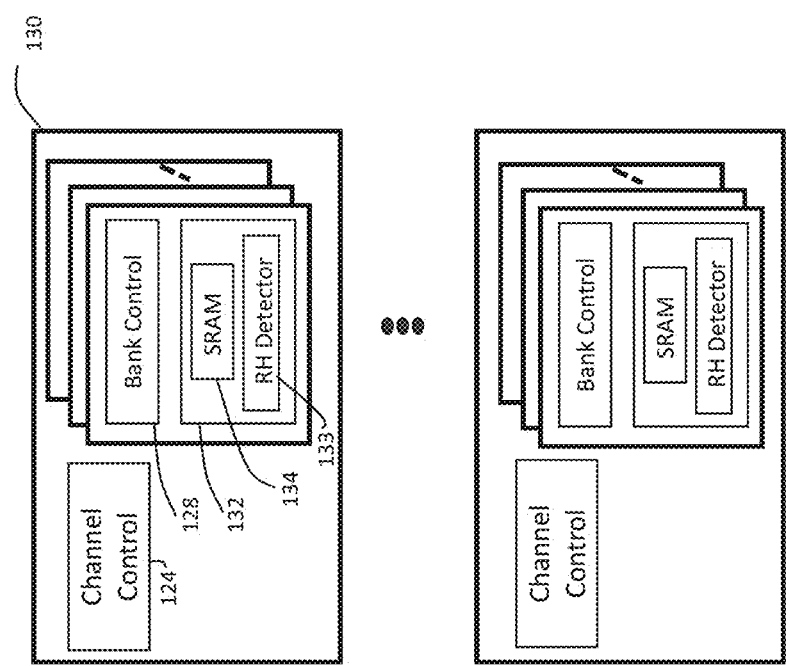
FIG. 4A illustrates a logical block diagram of a row hammer mitigation component implemented at the per-bank level where the row access counts are maintained in static random access memory (SRAM), according to some embodiments.
Figure 4B:
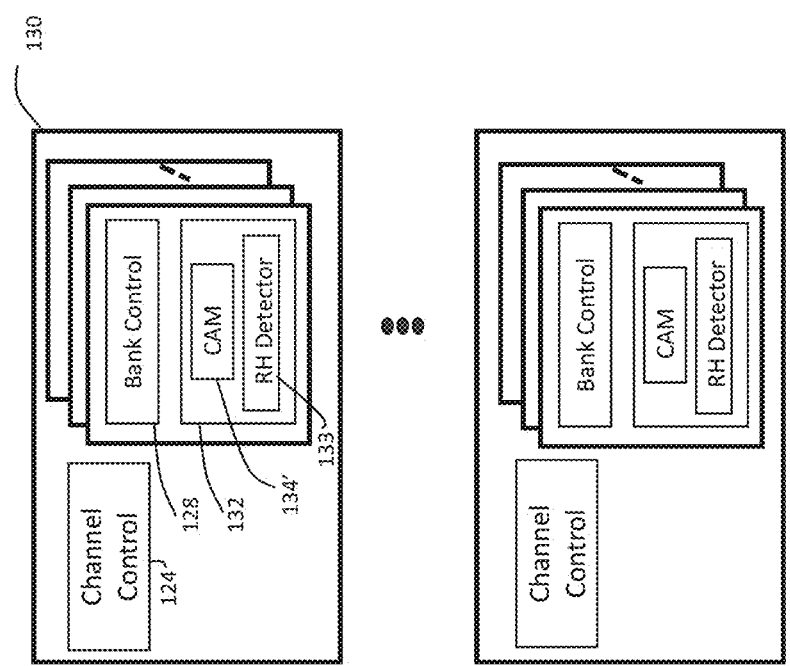
FIG. 4B illustrates a logical block diagram of a row hammer mitigation component implemented at the per-bank level where the row access counts are maintained in a content addressable memory (CAM), according to some embodiments.

FIG. 4A and FIG. 4B illustrate logical block diagrams of a row hammer mitigation component 132 at the per-bank level, according to respectively different embodiments. The row hammer mitigation component 132 is replicated for each bank of the attached memory device 126 that is accessed by the memory controller 100. As shown in FIG. 1A, each media controller 120 accessing the media device 126 may have a plurality of row hammer mitigation components 132, such that each bank controlled by the channel corresponding to that media controller has a corresponding respective row hammer mitigation component 132.

The row hammer mitigation component 132 includes a row hammer detector 133 and a row activation count table that is an SRAM 134 in the embodiment shown in FIG. 4A and is a content addressable memory (CAM) 134' in the embodiment shown in FIG. 4B. The row hammer detector 133 includes circuitry that monitors the corresponding bank of the memory device 126 for row hammer attacks and when an attack or potential attack is detected, responds appropriately. The row activation count table (SRAM 134 or CAM 134') is used by the row hammer detector 133 to maintain counters and other state associated with the row hammer detection of the corresponding bank. Additional required state associated with the row hammer detection may be maintained in d-flip flops associated with the row hammer detector 133.

The plurality of row hammer mitigation components 132, in the embodiments primarily described in this disclosure, are included in the memory controller 100. Including the row hammer mitigation circuitry, for example, the plurality of row hammer mitigation components 132, in the memory controller 100 is advantageous because all accesses to the memory devices 126 protected by the row hammer mitigation circuitry flow through the memory controller 100. However, embodiments of this disclosure are not limited to implementing the plurality of row hammer mitigation components 132 in the memory controller 100. In some embodiments, the plurality of per-bank row hammer components 132 can be implemented externally to the memory controller. Moreover, embodiments may not be limited to storing the counters in SRAM or CAM.

Figure 1B:
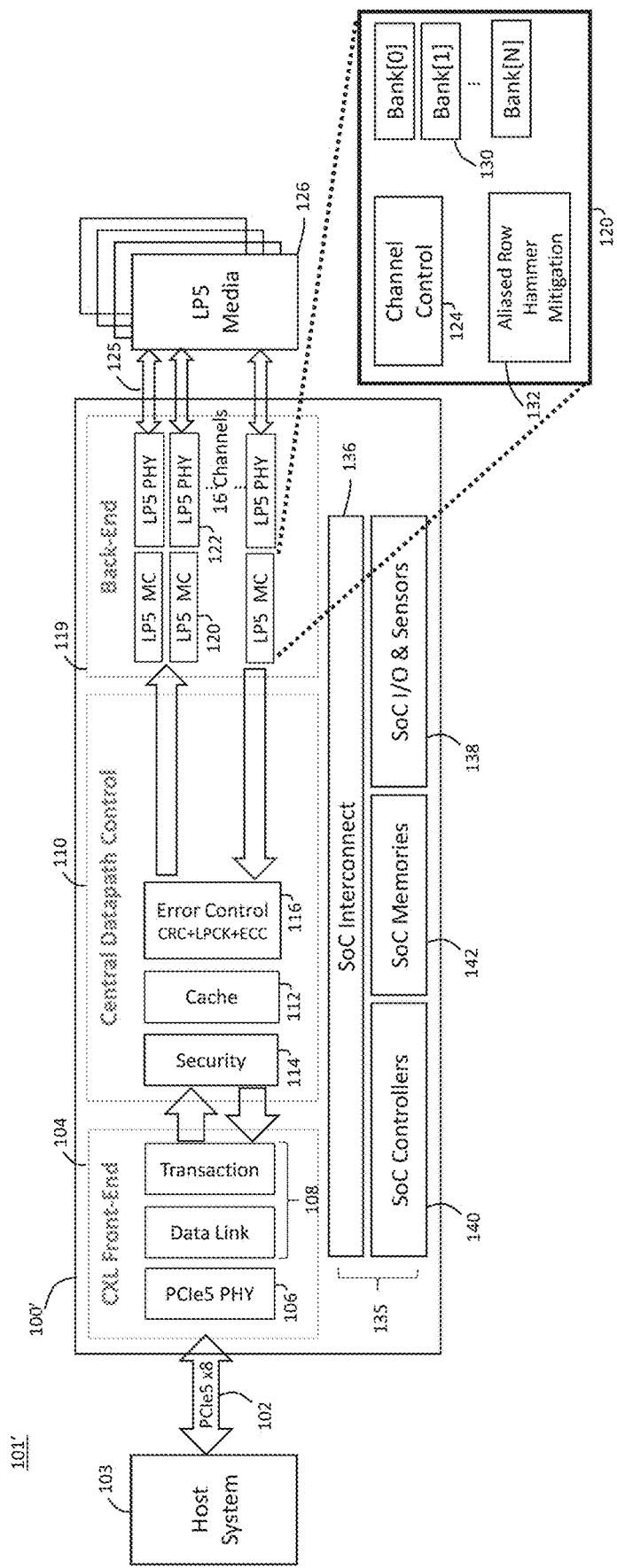
Figure 1C:
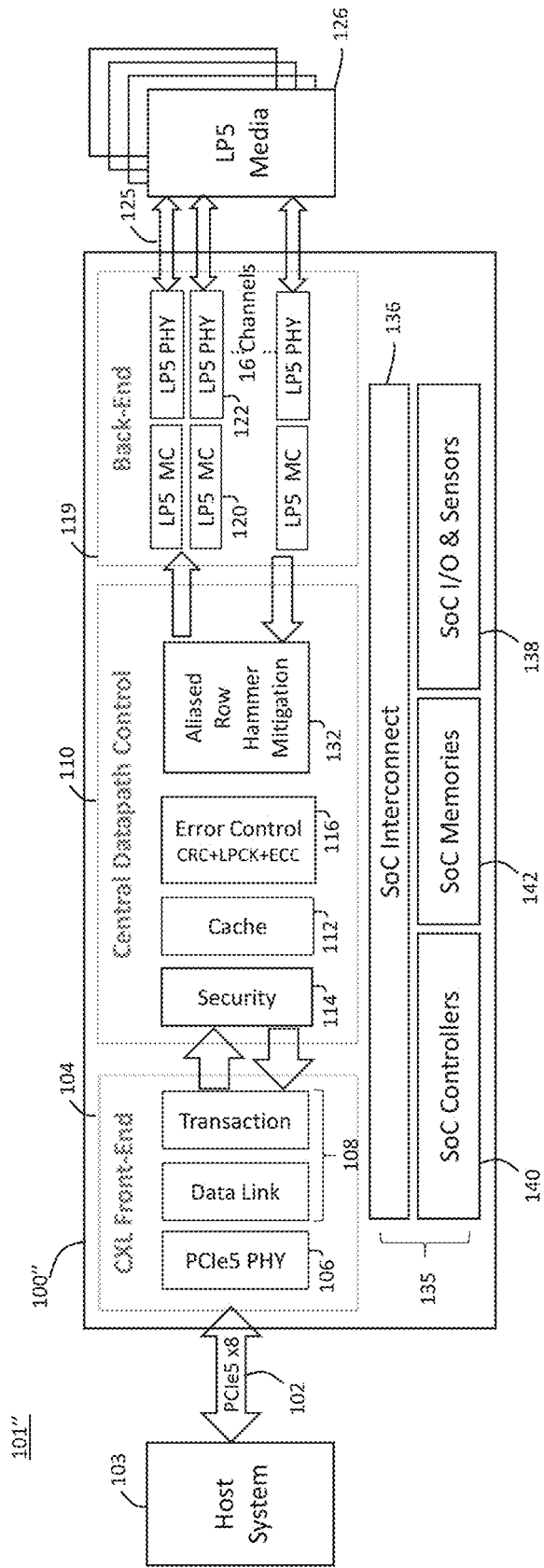

In some embodiments, the instead of implementing the row hammer detector at the per bank level as shown in FIGS. 4A/4B and FIG. 1A, the row hammer detector can be implemented at the per channel (i.e., one row hammer detector component 132 on the memory controller 100 for each channel 120, as shown, for example, in FIG. 1B) at the media device level (i.e., one row hammer component 132 on the memory controller 100 for each media device 126, as shown, for example, in FIG. 1C).

Figure 5:
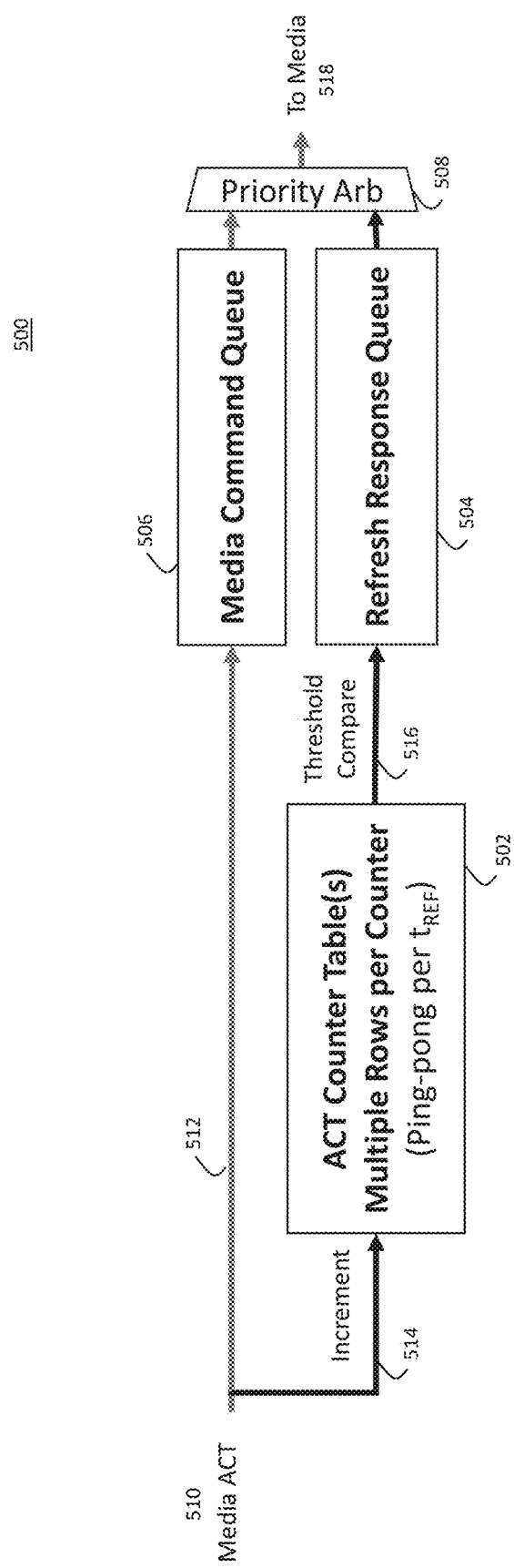
FIG. 5 schematically illustrates circuitry for row hammer mitigation using row access counters for use in an apparatus such as that shown in FIGS. 1A-1C, according to some embodiments.

FIG. 5 schematically illustrates circuitry 500 for row hammer mitigation using row access counters where each counter represents more than a single row of storage in the memory media, for use in an apparatus such as that shown in FIGS. 1A-1C, according to some embodiments. In an example embodiment, row hammer detector component 132 (see e.g., FIG. 1A and FIG. 4A-B) includes a row access counter (also referred to as ACT counter or row activation counter) circuitry 502, refresh response queue 504, media command queue 506 and priority arbiter 508.

In an example embodiment, the row hammer component 132, and thus the circuitry 500, is implemented on a memory controller 100. The circuitry 500 receives media row access commands 510 from the host system 103. Some media row access commands 510 may be generated internally to the memory controller 100 (e.g., cache 112 misses). The stream of media access requests may be considered an infinite data stream. Circuit 502 is configured to count these requests in finite intervals. Each media row access command 510 received in the circuitry 500 is input 512 to the media command queue 506. The media command queue 506 may be implemented as a memory buffer to store at least one media row access command before the command is provided to a media device 518 (e.g., media device 126 connected to memory controller 100 in FIG. 1A).

Each media row access command, and/or an indication of such command, also concurrently causes the counter circuitry 502 to be incremented 514 and threshold tested 516. The tested threshold, referred to herein as the "configured triggering threshold", is set equal to the RHT or lower than the RHT (e.g., threshold=RHT−1). If the threshold test 516 detects that the counter has exceeded the configured triggering threshold, one or more refresh commands that provide a row hammer response are input to the refresh response queue 504. For example, a row activation for row A (e.g., a row access to row A) causes a row activation command for row A to be enqueued in media command queue 506, and concurrently causes the counter corresponding to row A to be incremented and tested against the threshold in the circuitry 502. If the counter for row A exceeds the configured threshold, a row hammer event is detected on row A, and in response one or more refresh commands to refresh row A's adjacent rows are enqueued in the refresh response queue 506.

The priority arbiter 508 selects, from the commands enqueued in the media command queue 506 and the refresh response queue 504, commands to be sent to the memory media device 518. When the next command to be scheduled for execution in the media command queue 506 and the next command to be scheduled for execution in the refresh response queue 504 in a cycle are for the same row, the arbiter 508 may give priority to the refresh response queue 504. In this manner, the arbiter may opportunistically ensure that a row is refreshed before a next access. In an example embodiment, if the circuitry 502 sets the configured triggering threshold at least one below the RHT (i.e., threshold=RHT−1), and an access to row A exceeds the configured triggering threshold, then that access to row A and the corresponding refresh command (generated due to the exceeding of the configured triggering threshold) may be the next command to be scheduled from command queue 506 and the refresh response queue 504, respectively. In that sequence of events, by scheduling the refresh command for row A before scheduling the row access command for row A, the priority arbiter 508 can ensure that the row access command is responded to with correct data.

In some example embodiments, the row hammer circuit component 132 includes the circuit 502, the refresh response queue 504, the media command queue 506, and the priority arbiter 508. In another embodiment, the row hammer circuit component 132 includes the circuit 502, the refresh response queue 504 and the priority arbiter 508. In another embodiment, the media command queue 506 and/or the priority arbiter 508 are implemented outside of the row hammer circuit component 132, in the media device.

Figure 6:
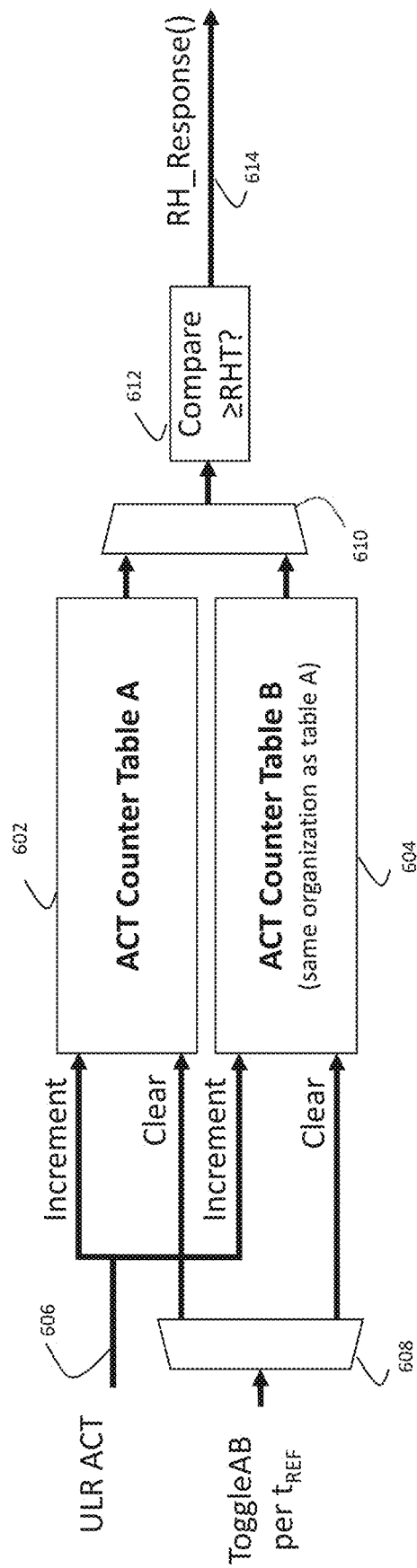
FIG. 6 schematically illustrates circuitry for incrementing row access counters for use in an implementation such as that shown in FIG. 5, according to some embodiments.
Figure 7A:
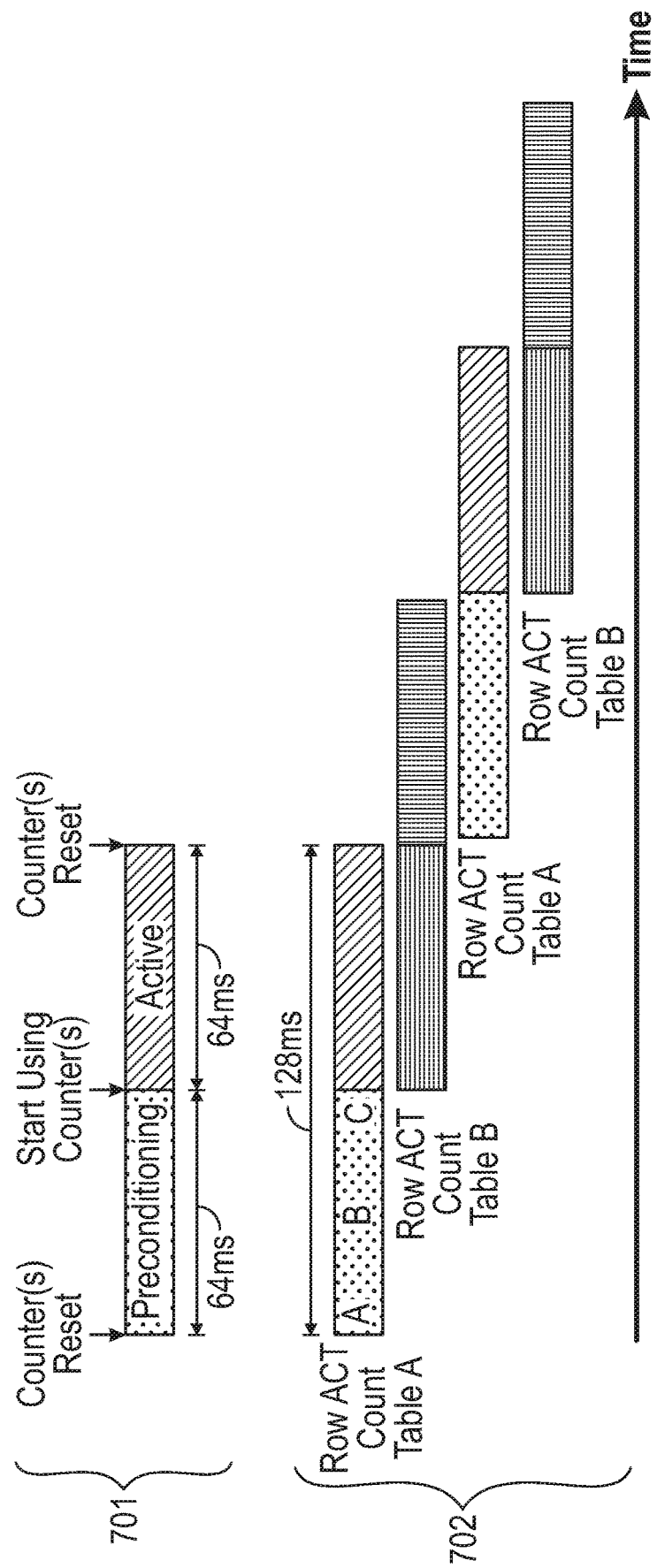
FIG. 7A and FIG. 7B illustrate the row access counts being maintained in two tables concurrently counting and arranged to operate in a ping-pong manner, according to a first embodiment.
Figure 7B:
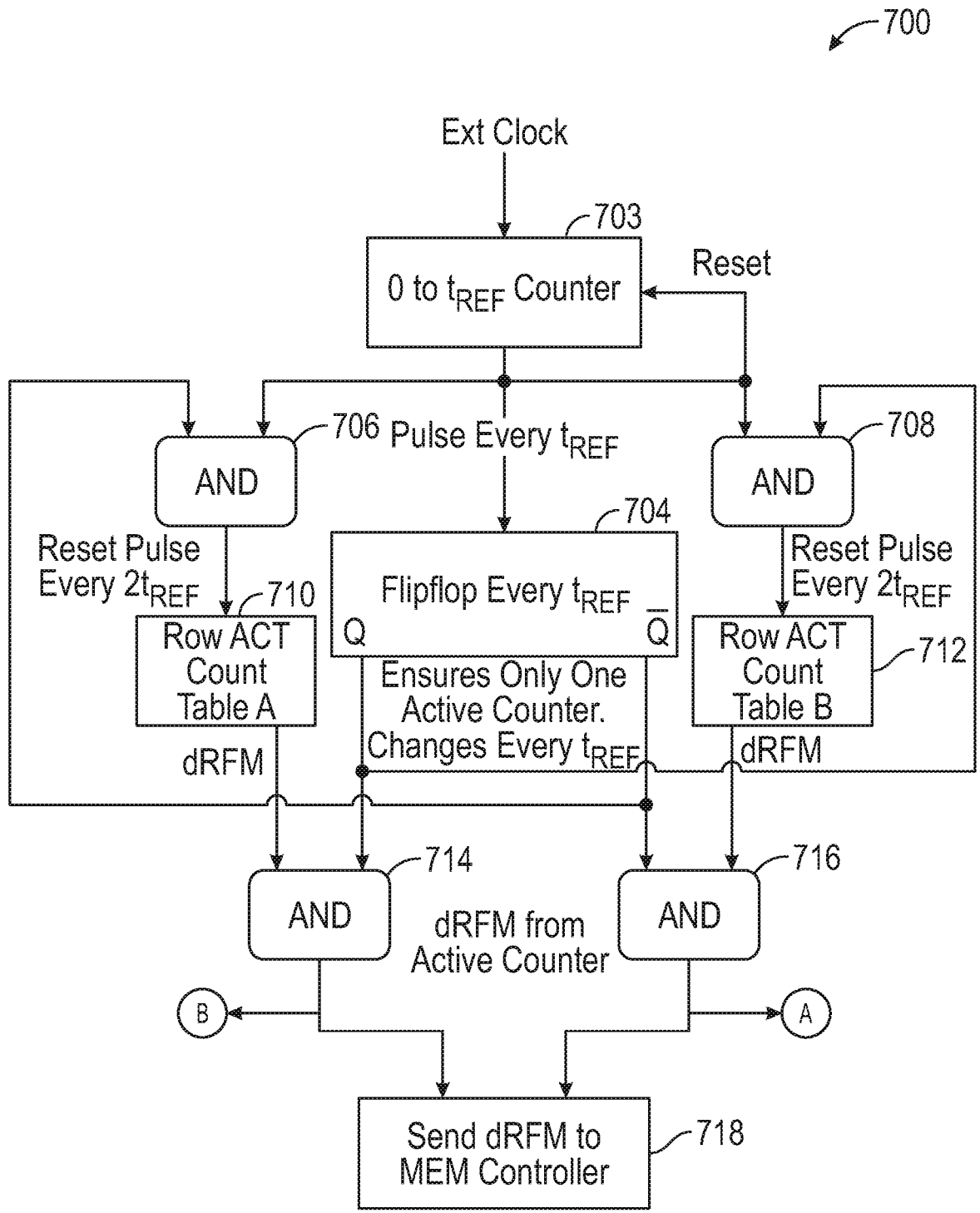
Figure 8A:
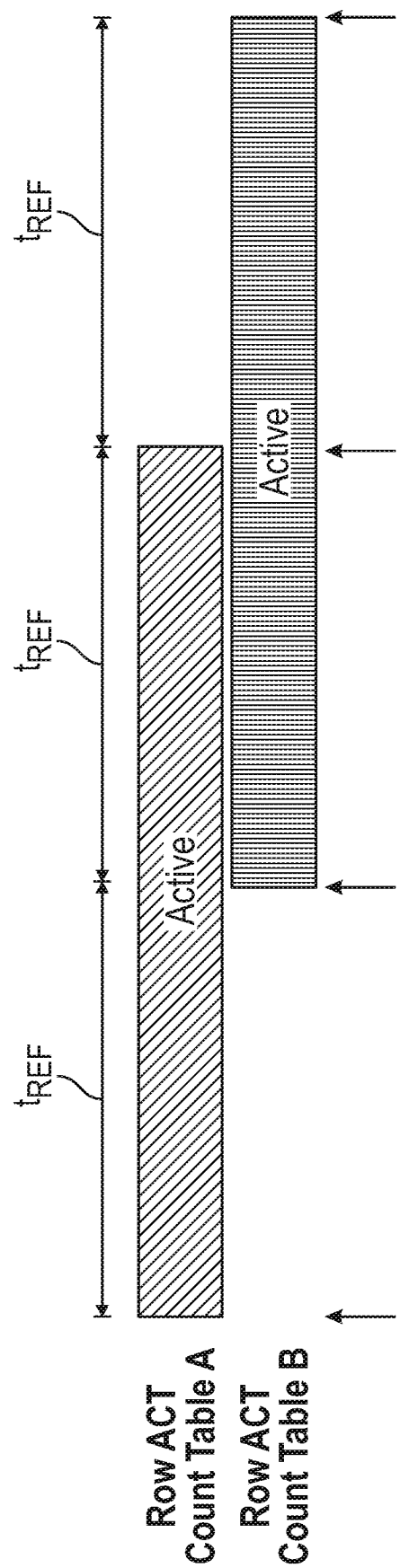
FIG. 8A and FIG. 8B illustrate the row access counts being maintained in two tables concurrently counting and arranged to operate in a ping-pong manner, according to a second embodiment.
Figure 8B:
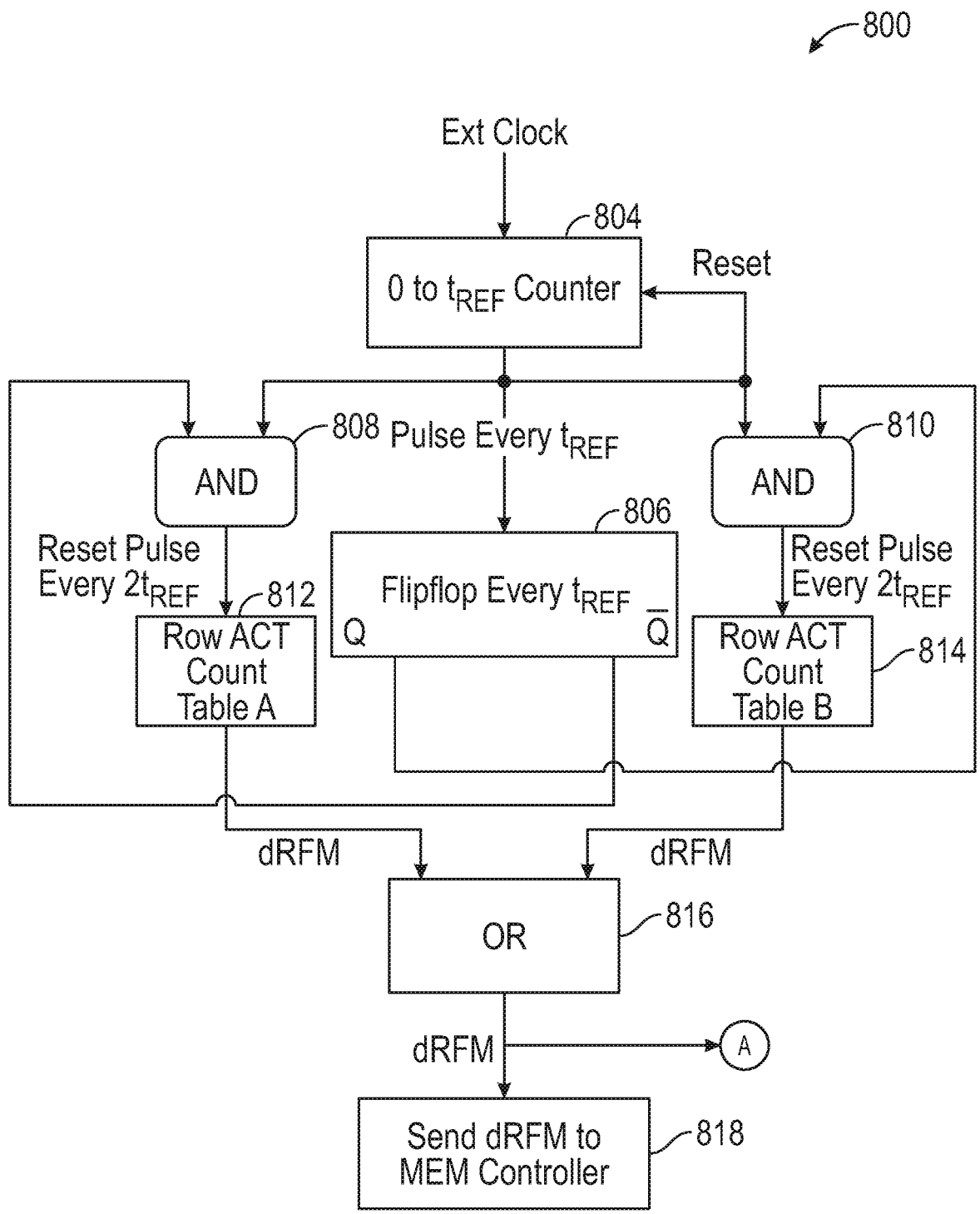

FIG. 6 schematically shows an example ping-pong implementation of the row activation counters to count row activations of a memory media in a row hammer mitigation implementation such as that described in relation to FIG. 5, FIG. 7B and FIG. 8B, according to some embodiments.

Any counter-based logic needs reset. Because different memory media rows refresh at different internal media determined times, the ideal time to reset an external counter for a particular media row may be configurable or determined at boot time. Periodic ping-pong reset is a safe counter reset that is possible when paired counters are used in a ping-pong scheme. The time between resets of any particular counter may be configurable, and is e.g., 128 ms ($2 \times t_{REF}$) in some embodiments. According to an embodiment, during a first $t_{REF}$ period the row access counter(s) is in preconditioning state where it is counting but not sending dRFM. During the next $t_{REF}$ period the row access counter(s) is counting as well as triggering dRFM command(s) or other row hammer response.

A second set of row access counter(s) operates similarly but is offset by $t_{REF}$ from the first set of row access counter(s). One set of row access counters is always active to trigger dRFM commands.

This approach eliminates false negative dRFM triggers. However, this approach requires two sets of counters, meaning twice the silicon area and the power. Moreover, there is the potential dRFM is sent based on counts from $2 \times t_{REF}$.

FIG. 6 illustrates an example high level schematic illustration of a ping-pong reset scheme using two row access counter tables—table A 602 and table B 604. Both row activation counter tables 602 and 604 may have the identical structure and counters.

When an increment event 606 is received for an aggressor row, the counter corresponding to the aggressor row is identified and the corresponding counter is updated in each of the tables 602 and 604. Although both tables are continually updated for each incoming operation, in some embodiments at any given time one of the tables is considered the active table. For the compare 610 to the configured triggering threshold, the value of the aggressor row counter is selected from the active table at the time. Based on the result of the compare 610, a row hammer response 612 may be issued.

The row access counter tables 602 and 604 are referred to as ping-pong because the active table status alternates between the two tables. At regular time intervals, a reset circuit 608 resets all counters in exactly one of the tables 602 or 604. The most recently reset table operates as the backup table, while the other operates as the active table.

Figure 7C:
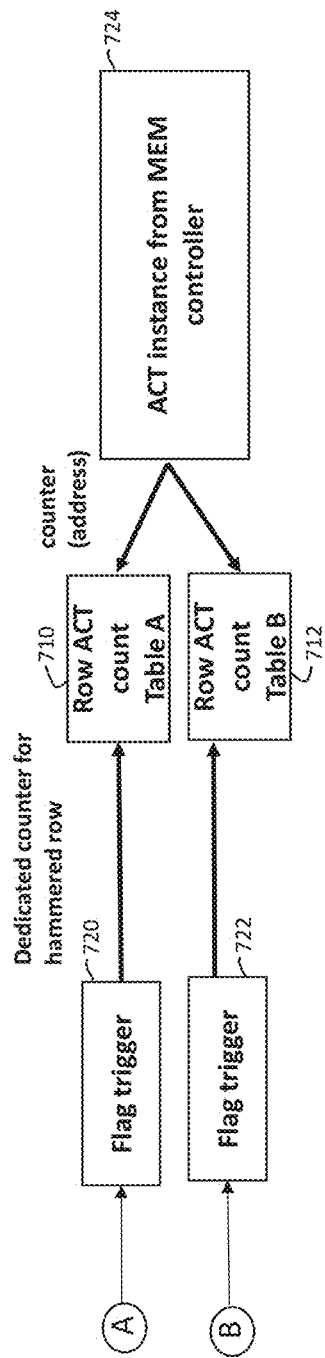
FIG. 7C illustrates another portion of the ping-pong reset circuit depicted in FIG. 7B.

FIGS. 7A-7C describe row activation counting in an example first embodiment of the present disclosure. In the first embodiment, while two row hammer count tables continue counting row activation events and are reset at a time offset of $t_{REF}$ relative to each other, at any given time interval of $t_{REF}$ duration a row hammer response (or a row hammer response generation signal) will only be issued based on the counters of one of the row activation count tables.

FIG. 7A illustrates that in the example first embodiment, two row activation count tables, which can be implemented in CAM or other memory such as SRAM as described above, are implemented in a ping-pong manner by having their reset events spaced apart from each other by $t_{REF}$ (e.g., in the illustrated embodiment, 64 ms), and enabling only one of the row activation count tables to be used to generate a row hammer response (e.g., dRFM) during any particular $t_{REF}$ time interval. In the top portion 701 of FIG. 7A, the "preconditioning" stage and the "active" stage of a single counting cycle of a single row activation count table is illustrated. Each stage is of 1 $t_{REF}$ duration. The table continues to count row activations in both stages but is considered for row hammer response generation only during its active stage. For example, for the table represented in 702, the counters are reset at the beginning of the $1^{st}$ $t_{REF}$ initiating the preconditioning stage, and counting is initiated. At the end of the $1^{st}$ $t_{REF}$, that is at the end of the preconditioning stage, the active stage is initiated, and the row activation counting is continued uninterrupted. As indicated by the annotation "start using counter(s)" in the figure, at the end of the $1^{st}$ $t_{REF}$, which is also the beginning of the $2^{nd}$ $t_{REF}$, the counters of that table begin to be considered for row hammer response generation. At the end of the $2^{nd}$ $t_{REF}$, that table is reset.

The interleaving of the counting cycles of the two tables are shown in the lower portion 702 of FIG. 7A. In the illustration, while the preconditioning stage and the active stage are illustrated with different fill patterns with respect to each other, the same fill patterns are used for a particular table. It is shown that at any given time, one of the tables is in the preconditioning stage and the other is in the active stage.

FIG. 7B shows a schematic of a ping-pong reset circuit 700 according to some embodiments. An external clock serves as input to circuit 700. Based on the input clock, a 0 to $t_{REF}$ counter 703 generates a pulse every $t_{REF}$ (e.g., 64 ms). As noted above, each memory media device 126 may have respectively different $t_{REF}$, and therefore, in some embodiments, the $t_{REF}$ may be configurable. The illustrated 64 ms $t_{REF}$ interval is an example only, and it will be understood that $t_{REF}$ may be a time duration greater or less than 64 ms.

Based on the pulse from counter 703 a flip-flop 704 toggles output between 0 and 1 every $t_{REF}$. At each $t_{REF}$ pulse, either row access count table A ("Table A") 710 is reset and row access count table B ("Table B") 712 is set to active stage (i.e., able to trigger dRFM), or vice versa. The reset clears out all of the row activation counters in the table.

Both Table A 710 and Table B 712 receive and count all memory media row activations (ACTs or row accesses) during both stages. Both Table A and Table B may trigger dRFM (or other row hammer mitigation response or request for such a response) when they reach the memory media RHT count (or the configured triggering threshold), but based on the state of the flip-flop 704, only the one of the tables that is "active" can trigger a dRFM, the other table is ignored. Component 718 generates the dRFM to the memory media controller to be transmitted to the memory device 126.

The AND circuits 706 and 708 each receive the per-$t_{REF}$ pulses from $t_{REF}$ counter 703 and receives a signal from the flip-flop circuit 704 indicating whether the corresponding table (i.e., Table A or Table B) is enabled for reset. Each AND circuit 706 or 708 will then enable a reset signal to its corresponding table only when the $t_{REF}$ signal is enabled (indicating the completion of a $t_{REF}$ interval) and the signal from the flip-flop circuit 704 is enabled (indicating that the corresponding table is enabled to be reset, e.g., it is $2 \times t_{REF}$ from its last reset).

The AND circuits 714 and 716 each receives a signal from the flip-flop circuit 704 indicating whether the corresponding table is enabled to issue row hammer responses (e.g., dRFM) in the current $t_{REF}$ interval. The AND circuits 714 and 716 are each also configured to receive signals from its corresponding table to generate row hammer responses when any of its counters exceed the RHT. Each AND circuit 714 and 716 will output a row hammer response signal only when both its inputs, the signal from the corresponding table indicating the presence of a counter exceeding the RHT and the signal from the flip-flop circuit indicating the corresponding table is enabled to generate row hammer responses in the current $t_{REF}$, are enabled.

Thus, in this embodiment, in any given $t_{REF}$ interval, component 718 can receive a row hammer response (or row hammer response generation request) only from one of the AND circuits 714 and 716. The component 718 is configured to receive row hammer responses (or row hammer response generation requests) and to transmit corresponding row hammer responses (e.g., dRFM) or requests to the memory controller portions to be transmitted to the media device 126.

FIG. 7C shows another portion of the ping-pong reset circuit 700 shown in FIG. 7B. Flag trigger circuits 720 and 722 are configured to be triggered by a row hammer response signals from the AND circuits 714 and 716 to set a flag for the aggressor row identified in the row hammer signal.

Thus, in response to the response generation signal (or when the table determines that the RHT for a counter is exceeded), that counter is reset to 0 and a flag is set. The flag may be set flag trigger circuits 720 and 722. The resetting of the counter to 0 may be performed by the table or another associated circuit. Additionally, the circuit 700 includes the capability either in the respective tables or in a separate circuit 724 to increment the corresponding row ACT counts in the tables in response to each received row access request, for example, upon being notified by the memory controller.

If the counter corresponding to the received row access request is not in the tables, that corresponding counter is inserted to the tables with a starting value equal the minimum value of any counter in the tables. If the tables were full, then the counter with the lowest value is evicted in favor of the insertion. Further, the tables themselves, circuit 724, or another circuit 722 may be triggered by the row hammer response or response request generated by the or circuits 714 or 716 (or component 718) to update the counters corresponding to the generated row hammer response or response request. In the first embodiment, the counter corresponding to the aggressor row is set to 0.

The flag, when set, indicates that the associated counter is dedicated to the aggressor row identified in the row hammer response or response generation request and is to be exempted from being evicted. The flags are cleared when the table is reset at the end of the $2 \times t_{REF}$ interval.

As noted above, Table A and Table B may in some embodiments be implemented as CAM tables and in other embodiments be implemented in another type of memory such as SRAM. Implementation in CAM may provide advantages in speed (e.g., since all entries in the table are searched simultaneously) but may be more costly than an SRAM implementation.

The ping-pong circuitry 700 may be implemented in the row hammer mitigation component 132. According to an embodiment, in the memory controller 100, a respective row hammer mitigation component 132 corresponding to each bank of the banks connected to attached media devices 126 will have its own circuitry to independently perform row hammer mitigation using a respective circuit 700. FIGS. 4A-4B, for example, show a respective row hammer mitigation component 132 implemented per-bank for each of a plurality of banks in a channel. However, embodiments are not limited to per-bank row hammer mitigation. As noted above, in some embodiments, the row hammer mitigation component 132 is implemented in a per-channel manner, or in a per memory device manner.

In the description above, it was assumed the row count update messages (e.g., row activation signals or row activation signal indications) received by the circuit 700 and the row hammer responses or response requests transmitted by the circuit 700 identifies the counter in a manner that is identifiable in Tables A and B. In the event that each counter in Table A and B does not correspond to a particular row in the memory media device, another component which may or may not be part of circuit 700, may be configured to perform the translation from the counter identifier in Tables A and B to one or more rows in the memory media device, and vice versa. Such a translation may be implemented also even if each counter in the tables correspond to a particular row in the memory media device in the event that the counter identifiers in the tables are mapped in some manner to respective row identifiers in the memory media device.

As noted above, the number of row ACT counters in either Table A or Table B in example embodiments is less than the number of rows in the memory media device 126 that is being monitored for row hammer attacks.

In the space saving technique implementation described in a U.S. patent application identified above, at any given instant in time, only a predetermined number k of rows (e.g., row identifiers) having the highest counts are stored in the table. In this implementation, or another implementation in which the counter identifies a single aggressor row in the memory media device, the row count update messages received by the circuit 700 can be either directly used (e.g., when the row identifier in the message is identical to the corresponding counter identifier in Table A and B) or used after translation (e.g., when the row identifier in the message corresponds according to some mapping to the corresponding counter identifier in Table A and B).

Another of the U.S. patent applications identified above provides an implementation in which an aliasing technique is used to maintain a number of counters that are smaller than the number of rows in the corresponding memory media device. Each aliased counter represents a predetermined group of rows in the memory media device. When each counter in Tables A and B corresponds to more than one row in the memory media device, the row count update messages is received for a particular row of the memory device 126 attached to the memory controller 100) received by the circuit 700 may be translated to map the identified aggressor row to a counter identifier in Tables A and B.

It should also be noted that in response to the row hammer response or row hammer response generation request triggered by a counter in Table A or Table B exceeding the configured RHT, one or more response messages (e.g., dRFM or other response shown in FIG. 9) may be transmitted by the memory controller to the memory media device. For example, when each counter in Tables A and B correspond to a respective row in the memory media device, one response message identifying the aggressor row can be transmitted to the memory media device.

However, when a counter in Tables A and B represents more rows in the memory media device than the aggressor row, respective response messages are transmitted by the memory controller for each of the rows represented by that counter. It should be noted that in some embodiments, the memory media device is capable of receiving a row hammer response identifying an aggressor row, and itself identifying the corresponding victim rows to be refreshed. In some other embodiments, the refresh messages for each of the corresponding victim rows can be transmitted by the memory controller.

Figure 8C:
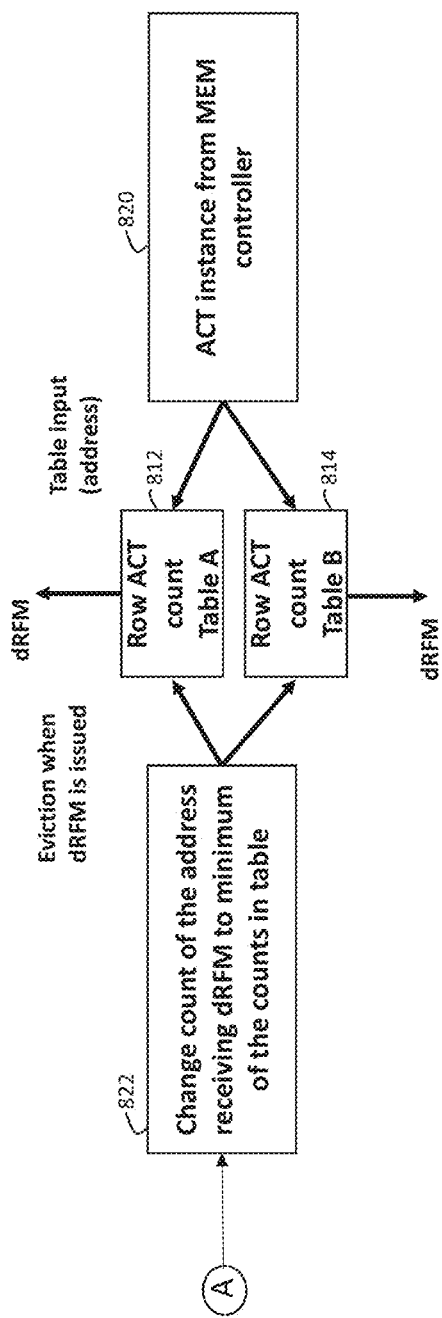
FIG. 8C illustrates the capability to increment corresponding row ACT counts according to the embodiments.

FIGS. 8A-8C describes row activation counting in an example second embodiment of the present disclosure. FIG. 8A illustrates that in the example second embodiment, the two row activation count tables have their respective reset events spaced apart by $t_{REF}$ from each other, and that the two row activation count tables continue in "active" mode (e.g., where each is enabled to generate row hammer responses or requests for responses) throughout.

FIG. 8A illustrates that in the example first embodiment, two row activation count tables, which can be implemented in CAM or other memory such as SRAM as described above, are implemented in a ping-pong manner by having their reset events spaced apart from each other by $t_{REF}$ (e.g., in the illustrated embodiment, 64 ms), and enabling both the tables to be used to generate a row hammer response (e.g., dRFM) or request for such response during any particular $t_{REF}$ time interval.

FIG. 8B shows a schematic of a ping-pong reset circuit 800 according to the second embodiment. Similarly, to the first embodiment described above, an external clock serves as input to circuit 800. Based on the input clock, a 0 to tREF counter 804 generates a pulse every tREF (e.g., 64 ms). Based on the pulse from counter 804 a flip-flop 806 toggles output between 0 and 1 every tREF. Row access counter(s) A 812 is reset when row access counter(s) B 814 becomes active (i.e., able to trigger dRFM) and vice versa.

Both row access counter(s) A 812 and row access counter(s) B 814 receive and count memory media row activations (ACTs). Both counter(s) A and counter(s) B trigger dRFM (or other row hammer mitigation response) when they reach the memory media RHT count (or the configured triggering threshold), but based on the state of the flip-flop 806, only the one of the row access counters that is "active" can trigger a dRFM, the other row access counter(s) is ignored. Component 818 generates the dRFM to the memory media controller to be transmitted to the memory device.

The components 804, 806, 808, 810 and 818 may be identical and may operate similarly to the components 703, 704, 706, 708, and 718, respectively, as described above in relation to the first embodiment. Table A 812 and Table B 814 may likewise be similar to Tables 710 and 712, respectively, described in relation to the first embodiment. The OR circuit 816 receives row hammer response or response requests from both tables 812 and 814 and transmits one response or response request to component 818 to send the response or response request to the memory controller.

As shown in FIG. 8C, the circuit 800 includes the capability either in the respective tables or in a separate circuit 820 to increment the corresponding row ACT counts in the tables in response to each received row access request, for example, upon being notified by the memory controller. If the counter corresponding to the received row access request is not in the tables, that corresponding counter is inserted to the tables with a starting value equal the minimum value of any counter in the tables.

If the tables were full, then the counter with the lowest value is evicted in favor of the insertion. Further, the tables themselves, circuit 820, or another circuit 822 may be triggered by the row hammer response or response request generated by the OR circuit 816 (or component 818) to update the counters corresponding to the generated row hammer response or response request. In the second embodiment, the counter corresponding to the aggressor row is set to the minimum value of all the counters in the table(s). In some embodiments, the counter corresponding to the aggressor row may be evicted from the table(s).

FIG. 9 illustrates a table of different row hammer attack response techniques that can be implemented in example embodiments. The refresh techniques include bias cache replacement, increased refresh, ACT/Pre neighbor rows, poor man's dRFM, dRFM, EDAC scrub neighbors, throttling row activations to CRHA rows (e.g., rows with high row activation counts), responding to the row access request with a Data Bad message, alerting and/or interrupting the host to indicate that the RHT has been exceeded. As illustrated in the table, several of the response techniques guarantee data integrity and also do not require the media device's repair map. Guarantee of data integrity increases the reliability of data read from the media device. Not requiring the repair map increases the flexibility of the response technique, and also the applicability of the response techniques to media devices from different manufacturers etc. As can be seen in FIG. 10, dRFM guarantees data integrity, does not require the media device's repair map, and also has a low response time, indicating it as a response technique that can be used efficiently in example embodiments. However, embodiments are not limited to using dRFM as the response to row hammer attacks.

Additionally, upon detection of a row hammer attack in an example embodiment, more row hammer response refresh messages may be sent to the memory media device than in an implementation which has an individual counter per row. Although having more than one row associated with the counter that exceeded RHT does not necessary mean that the number of affected rows (i.e., number of adjacent rows) are greater than in the case of one row per counter implementations, an example embodiment may generate a refresh response for each of the rows associated with the counter because the memory controller may not have knowledge of the memory media device's mapping of row identifiers to the actual physical row layout.

Moreover, in example embodiments, the worst-case denial of service (DoS) latency impact to subsequent memory access can be limited to only the duration required by one row hammer response by ensuring that configured triggering threshold is less than the RHT so that the media row is always refreshed just before the media access request that would exceed the RHT is received.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "transmit", "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components.

In some examples, the flow of signals between the connected components may be interrupted for a time, for example, using one or more intermediate components such as switches or transistors. The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium.

For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
two tables stored in memory, each table configured to store an identical number of counters;
circuitry configured to:
receive consecutive periodic signals of a first type at a regular fixed interval during a monitoring duration;
reset one, but not the other, of the two tables in response to each of a first signal of the consecutive periodic signals and every alternate signal of the consecutive periodic signals occurring after the first signal, and reset the other, but not the one, of the two tables in response to a second signal of the consecutive periodic signals and every alternate signal of the consecutive periodic signals occurring after the second signal, wherein the first signal and the second signal are consecutive signals;
increment a corresponding counter in each of the two tables in response to each second type of signal received during the monitoring duration;
generate a third type of signal when any one of the counters exceeds a predetermined threshold during the monitoring duration.

2. The apparatus according to claim 1, wherein the memory is a content addressable memory (CAM).

3. The apparatus according to claim 1, wherein the memory is a static random access memory (SRAM).

4. The apparatus according to claim 1, wherein the first type of signal is a reset signal, the second type of signal is a row access request or row access request indication received from a memory controller connected to a memory media device, and the third type of signal is a row hammer response or row hammer response generation request.

5. The apparatus according to claim 4, wherein the total number of counters in the plurality of counters is less than a total number of rows monitored by a memory error detector on the memory media device.

6. The apparatus according to claim 5, wherein each counter in the plurality of counters corresponds to a respective row monitored by a memory error detector on the memory media device.

7. The apparatus according to claim 5, wherein each counter in the plurality of counters corresponds to a plurality of rows monitored by a memory error detector on the memory media device.

8. The apparatus according to claim 7, wherein each counter in the plurality of counters corresponds to a same number of rows in the plurality of rows monitored by a memory error detector on the memory media device.

9. The apparatus according to claim 4, wherein the circuitry is further configured to, when said any one of the counters exceeds the predetermined threshold, initialize said any one of the counters.

10. The apparatus according to claim 9, wherein initializing comprises setting the any one of the counters to a minimum value of all counters in the plurality of counters.

11. The apparatus according to claim 9, wherein the circuitry is further configured to, when said any one of the counters exceeds the predetermined threshold, initialize said any one of the counters by setting the any one of the counters to zero and setting a flag associated with the any one of the counters, wherein the flag indicates that the any one of the counters is dedicated to a row of the memory media device currently associated with the any one of the counters.

12. The apparatus according to claim 11, wherein the circuitry is further configured to, in response to receiving the second type of signal, identifying a counter corresponding to a row associated with the second type of signal in the plurality of counters and incrementing the identified counter.

13. The apparatus according to claim 11, wherein the circuitry is further configured to, in response to receiving the second type of signal, determining whether a counter corresponding to a row associated with the second type of signal is present in the plurality of counters and, when the determining determines that the counter corresponding to the row associated with the second type of signal is not present, inserting the counter into the plurality of counters and incrementing the counter.

14. The apparatus according to claim 13, wherein the circuitry is further configured to, in response to a determining that the plurality of counters are at a maximum, evicting a counter from the plurality of counters to enable the inserting.

15. The apparatus according to claim 14, wherein the evicting comprises identifying a minimum counter in the plurality of counters and evicting the minimum counter.

16. The apparatus according to claim 1, wherein an input of each of the two tables is connected to a respective AND circuit, and a first input to each respective AND circuit is connected to a flip-flop circuit and a second input of each respective AND circuit is connected to an interval counter.

17. The apparatus according to claim 16, further comprising a third AND circuit connected to an output of the first of the two tables and to an output of the flip-flop circuit and a fourth AND circuit connected to an output of a second of the two tables and to an output of the flip-flop circuit.

18. The apparatus according to claim 17, wherein the third AND circuit and the fourth AND circuit are configured to select one of the third type of signals generated by the first table and the second table.

19. The apparatus according to claim 16, further comprising an OR circuit connected to an output of each of the two tables, wherein the OR circuit configured to select one of the third type of signals generated by the two tables.

20. A method comprising:
receiving consecutive periodic signals of a first type at a regular fixed interval during a monitoring duration;
resetting one, but not the other, of two tables in response to each of a first signal of the consecutive periodic signals and every alternate signal of the consecutive periodic signals occurring after the first signal, and reset the other, but not the one, of the two tables in response to a second signal of the consecutive periodic signals and every alternate signal of the consecutive periodic signals occurring after the second signal, wherein the first signal and the second signal are consecutive signals, and wherein the two tables are stored in memory and each table is configured to store an identical number of counters;
incrementing a corresponding counter in each of the two tables in response to each second type of signal received during the monitoring duration;
generating a third type of signal when any one of the counters exceeds a predetermined threshold during the monitoring duration.

* * * * *